(12) United States Patent
Fan

(10) Patent No.: US 8,947,130 B2
(45) Date of Patent: Feb. 3, 2015

(54) DRIVER HAVING LOW POWER CONSUMPTION AND METHOD THEREOF

(71) Applicant: IPGoal Microelectronics (Sichuan) Co., Ltd., Chengdu, Sichuan (CN)

(72) Inventor: Fangping Fan, Sichuan (CN)

(73) Assignee: IPGoal Microelectronics (Sichuan) Co., Ltd., Chengdu, Sichuan Province (CN)

( * ) Notice: Subject to any disclaimer, the term of this patent is extended or adjusted under 35 U.S.C. 154(b) by 0 days.

(21) Appl. No.: 13/963,389

(22) Filed: Aug. 9, 2013

(65) Prior Publication Data

US 2015/0002193 A1  Jan. 1, 2015

(30) Foreign Application Priority Data

Sep. 13, 2012 (CN) .......................... 2012 1 0335829

(51) Int. Cl.
*H03K 3/00* (2006.01)
*H03K 5/22* (2006.01)
*G05F 3/24* (2006.01)

(52) U.S. Cl.
CPC ..................................... *G05F 3/242* (2013.01)
USPC ................................ 327/108; 327/66; 326/83

(58) Field of Classification Search
CPC ... H03K 5/2481; H03K 5/249; H03K 5/2472; H03K 5/2418; H03K 3/02337; H03K 3/3565; H03K 19/00361; H04L 25/0272; H04L 25/028; H03F 3/45183
USPC ............. 327/108–112, 63–73, 170, 379, 389, 327/391, 427, 434, 437, 530, 538, 540, 327/541; 326/82, 83, 87, 21, 26
See application file for complete search history.

(56) References Cited

U.S. PATENT DOCUMENTS

| | | | | |
|---|---|---|---|---|
| 4,394,587 A | * | 7/1983 | McKenzie et al. | 327/66 |
| 5,488,321 A | * | 1/1996 | Johnson | 327/66 |
| 7,248,115 B2 | * | 7/2007 | Nishimura | 330/253 |
| 7,746,168 B2 | * | 6/2010 | Oishi | 330/252 |
| 8,542,038 B2 | * | 9/2013 | Huang et al. | 327/108 |
| 2005/0099234 A1 | * | 5/2005 | Perner et al. | 330/261 |

* cited by examiner

*Primary Examiner* — Lincoln Donovan
*Assistant Examiner* — Thomas Skibinski

(57) ABSTRACT

A driver having low power consumption includes a first input terminal, a second input terminal, an output terminal, a power supply terminal, a ground terminal, a driving circuit, an adjusting circuit connected to the driving circuit and a biasing circuit which is connected to the driving circuit and the adjusting circuit. A method for accomplishing low power consumption of a driver is also provided. The method accomplishes an object of low power consumption by dynamically adjusting a driving current of a driver according to a difference between inputted differential signals.

11 Claims, 1 Drawing Sheet

DRIVER HAVING LOW POWER CONSUMPTION AND METHOD THEREOF

BACKGROUND OF THE PRESENT INVENTION

1. Field of Invention

The present invention relates to a driver having low power consumption, and more particularly to a driver having low power consumption and a dynamically adjusted driving capacity.

2. Description of Related Arts

A driver is for enhancing a driving capacity of a weak driving signal to drive external devices having loads. The driving capacity is usually one of the technical qualifications of the drivers and is defined as a maximum output current which a driver is able to provide. It is required to consider a maximum load as the guidance of the design of the driver.

The maximum current of the conventional driver is constant without being affected by the input signals having different values; in other words, the driving capacity of the conventional driver is prevented from changing with the different values of the input signals, in such a manner that the driver always outputs identical driving currents in whatever cases, which increases the power consumption of the driver. Thus, it is necessary to provide a driver having low power consumption and a dynamically adjusted driving capacity.

SUMMARY OF THE PRESENT INVENTION

An object of the present invention is to provide a driver having low power consumption and a dynamically adjusted driving capacity and a method thereof.

A driver having low power consumption comprises a first input terminal, a second input terminal, an output terminal, a power supply terminal, a ground terminal, a driving circuit which is connected to the first input terminal, the second input terminal, the output terminal, the power supply terminal and the ground terminal, an adjusting circuit which is connected to the driving circuit, the power supply terminal and the ground terminal, and a biasing circuit which is connected to the driving circuit, the adjusting circuit, the power supply terminal and the ground terminal. The driving circuit comprises a first field effect transistor (FET) connected to the first input terminal, a second FET connected to the second input terminal, a third FET which is connected to the first FET and the second FET, a fourth FET connected to the first FET, a fifth FET connected to the second FET, a sixth FET connected to the fourth FET, a seventh FET connected to the fifth FET, an eight FET connected to the sixth FET, and a ninth FET connected to the seventh FET. The adjusting circuit comprises a tenth FET connected to the sixth FET, an eleventh FET connected to the tenth FET, a twelfth FET connected to the tenth FET, a first current source connected to the tenth FET, a thirteenth FET connected to the eleventh FET, and a second current source connected to the eleventh FET. The biasing circuit comprises a fourteenth FET which is connected to the twelfth FET and the thirteenth FET, a fifteenth FET connected to the fourteenth FET, and a third current source connected to the fourteenth FET.

A method for accomplishing low power consumption of a driver comprises step of: providing a device comprising a first input terminal, a second input terminal, an output terminal, a power supply terminal, a ground terminal, a driving circuit which is connected to the first input terminal, the second input terminal and the output terminal, an adjusting circuit connected to the driving circuit and a biasing circuit which is connected to the driving circuit and the adjusting circuit. The driving circuit is for amplifying differential signals of the first input terminal and the second input terminal and sending the differential signals into the output terminal; the adjusting circuit is for adjusting a driving circuit of the driving circuit according to a difference between the differential signals of the first input terminal and the second input terminal; and the biasing circuit is for processing the driving circuit with direct current (DC) biasing. The method further comprises steps of: inputting a pair of differential signals into the driving circuit by the first input terminal and the second input terminal; dynamically adjusting a driving current of the driving circuit according to a difference between the pair of differential signals by the adjusting circuit, specifically comprising increasing the driving current of the driving circuit by the adjusting circuit when the difference between the pair of differential signals increases and decreasing the driving current of the driving circuit by the adjusting circuit when the difference between the pair of differential signals decreases; and amplifying the pair of differential signals according to the driving current which is provided by the adjusting circuit and then sending the pair of differential signals into the output terminal by the driving circuit.

Therefore, the driver provided by the present invention accomplishes dynamically adjusting the driving capacity of the driver according to the difference between the differential signals of the first input terminal and the second input terminal and relatively economically utilizes the current, so as to further accomplish the object of low power consumption.

These and other objectives, features, and advantages of the present invention will become apparent from the following detailed description, the accompanying drawings, and the appended claims.

DETAILED DESCRIPTION OF THE PREFERRED EMBODIMENT

Figure 1:
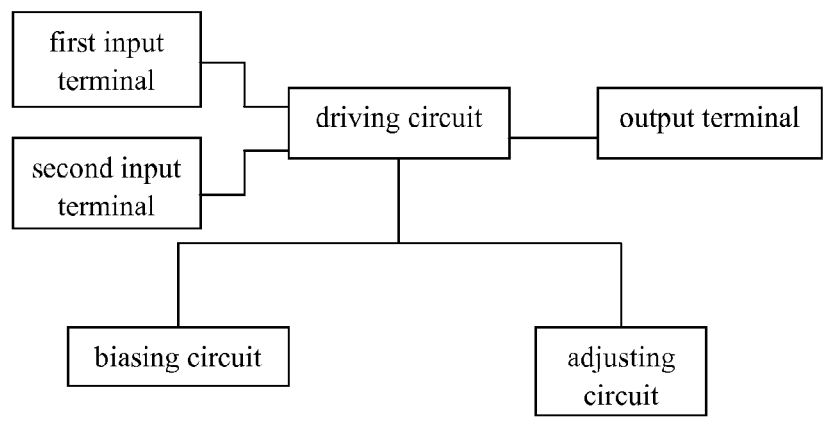
FIG. 1 is a system block diagram of a driver having low power consumption according to a preferred embodiment of the present invention.

Referring to FIG. 1 of the drawings, according to a preferred embodiment of the present invention, a driver having low power consumption comprises a first input terminal INN, a second input terminal INP, an output terminal VOUT, a power supply terminal VCC, a ground terminal GND, a driving circuit for amplifying differential signals which are inputted by the first input terminal INN and the second input terminal INP, an adjusting circuit connected to the driving circuit for adjusting a driving current of the driving circuit, and a biasing circuit connected to the driving circuit for providing an appropriate working current.

The first input terminal INN and the second input terminal INP input a pair of differential signals into the driving circuit; the adjusting circuit dynamically adjusts the driving current of the driving circuit according to a difference between the pair of differential signals, wherein the adjusting circuit increases the driving current of the driving circuit when the difference between the differentials signals increase and decreases the driving current of the driving circuit when the difference between the differential signals decreases; and the driving circuit amplifies the differential signals according to the driving current provided by the adjusting circuit and then sends the differential signals into the output terminal VOUT.

Figure 2:
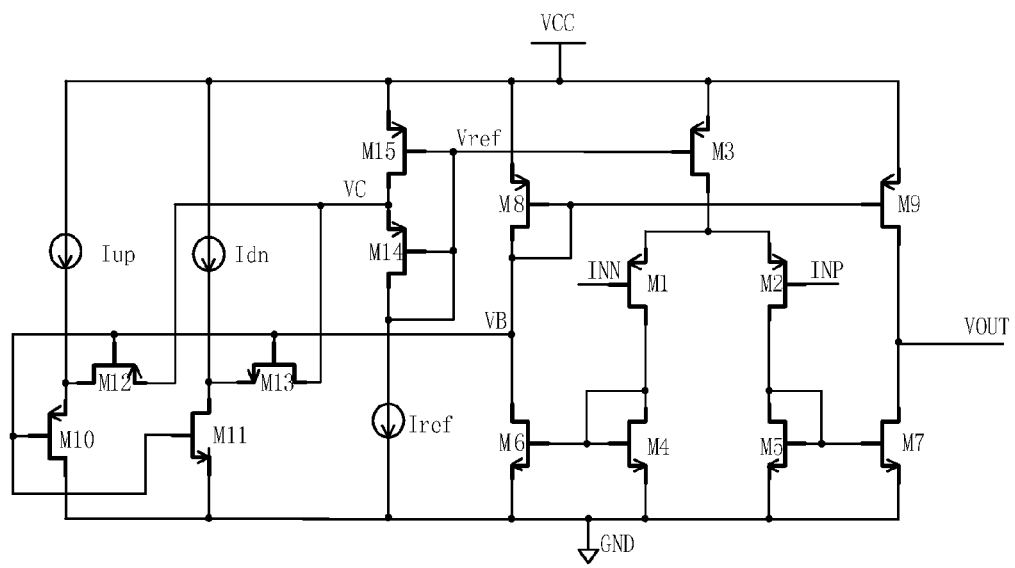
FIG. 2 is a sketch view of a circuit of the driver according to the preferred embodiment of the present invention.

Further referring to FIG. 2, according to the preferred embodiment of the present invention, a circuit of the driver is showed, wherein the driving circuit comprise a first FET M1, a second FET M2, a third FET M3, a fourth FET M4, a fifth FET M5, a sixth FET M6, a seventh FET M7, an eighth FET M8 and a ninth FET M9; the adjusting circuit comprises a tenth FET M10, an eleventh FET M11, a twelfth FET M12, a thirteenth FET M13, a first current source Iup and a second current source Idn; and the biasing circuit comprises a fourteenth FET M14, a fifteenth FET M15 and a third current source Iref.

According to the preferred embodiment of the present invention, the driver has following connections. A gate electrode of the first FET M1 is connected to the first input terminal INN. A gate electrode of the second FET M2 is connected to the second input terminal INP. A source electrode of the first FET M1, a source electrode of the second FET M2 and a source electrode of the third FET M3 are connected. A drain electrode of the first FET M1, a gate electrode and a drain electrode of the fourth FET M4 and a gate electrode of the sixth FET M6 are connected. A drain electrode of the second FET M2, a gate electrode and a drain electrode of the fifth FET M5 and a gate electrode of the seventh FET M7 are connected. A drain electrode of the sixth FET M6, a gate electrode and a drain electrode of the eighth FET M8, a gate electrode of the ninth FET M9, a gate electrode of tenth FET M10, a gate electrode of the eleventh FET M11, a gate electrode of the twelfth FET M12 and a gate electrode of the thirteenth FET M13 are connected. A drain electrode of the seventh FET M7 and a drain electrode of the ninth FET M9 are both connected to the output terminal VOUT. A gate electrode of the third FET M3, a gate electrode of the fifteenth FET M15, a gate electrode and a source electrode of the fourteenth FET M14 are all connected to a first terminal of the third current source Iref. A drain electrode of the fifteenth FET M15, a source electrode of the fourteenth FET M14, a source electrode of the twelfth FET M12 and a drain electrode of the thirteenth FET M13 are connected. A drain electrode of the twelfth FET M12 and a source electrode of the tenth FET M10 are connected to a first terminal of the first current source Iup. A source electrode of the thirteenth FET M13 and a drain electrode of the eleventh FET M11 are connected to a first terminal of the second current source Idn. A source electrode of the third FET M3, a source electrode of the eighth FET M8, a source electrode of the ninth FET M9, a source electrode of the fifteenth FET M15, a second terminal of the first current source Iup and a second terminal of the second current source Idn are all connected to the power supply terminal VCC. A source electrode of the fourth FET M4, a source electrode of the fifth FET M5, a source electrode of the sixth FET M6, a source electrode of the seventh FET M7, a source electrode of the eleventh FET M11, a drain electrode of the tenth FET M10 and a second terminal of the third current source Iref are all connected to the ground terminal GND.

The driver provided by the present invention has following working principles. The first input terminal INN and the second input terminal INP together input a pair of differential signals into the driving circuit and then the pair of differential signals are amplified and outputted into the output terminal VOUT by the driving circuit. The adjusting circuit dynamically adjusts a current of the third FET M3 by detecting the difference between the differential signals of the first input terminal INN and the second input terminal INP, so as to accomplish an object of changing a driving capacity of the output terminal VOUT.

When a voltage value of the first input terminal INN and a voltage value of the second input terminal INP are set to be identical, supposing that a current of the first current source Iup totally runs through the tenth FET M10 and that a current of the second current source Idn totally runs through the eleventh FET M11, which means that no current runs through the twelfth FET M12 and the thirteenth FET M13, the current running through the third FET M3 is a current of the third current source Iref and herein the whole driver reaches a smallest driving capacity and also a lowest power consumption. When the first input terminal INN and the second input terminal INP have different voltage values, two situations are illustrated as follows.

When the voltage value of the first input terminal INN is larger than that of the second input terminal INP, a gate electrode voltage VB of the eighth FET M8 increases, which leads to a turning off of the twelfth FET M12 and a turning on of the thirteenth FET M13; herein a current running through the eleventh FET M11 sharply increases and accordingly a current running through the fifteenth FET M15 sharply increases because the second current source Idn is unable to provide surplus current, which is equivalent to a sharp increase in the current running through the third FET M3, in such a manner that the driving current of the driving circuit increases and further the driving capacity of the whole driver also increases. Herein the output terminal VOUT is at a falling edge, which means the capacity of driving the falling edge is enhanced.

When the voltage value of the first input terminal INN is smaller than that of the second input terminal INP, the gate electrode voltage VB of the eighth FET M8 decreases, which leads to a turning off of the thirteenth FET M13 and a turning on of the twelfth FET M12; herein a current running through the tenth FET M10 sharply increases and accordingly the current running through the fifteenth FET M15 sharply increases because the first current source Iup is unable to provide surplus current, which is equivalent to a sharp increase in the current running through the third FET M3, in such a manner that the driving current of the driving circuit increases and further the driving capacity of the whole driver also increases. Herein the output terminal VOUT is at a rising edge, which means the capacity of driving the rising edge is enhanced.

Concluded from the above working principles, the driver provided by the present invention accomplishes a dynamic adjustment of the driving capacity of the driver according to the difference between the differential signals of the first input terminal INN and the second input terminal INP and an object of low power consumption by relatively economically utilizing the current.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A driver having low power consumption, comprising a first input terminal, a second input terminal, an output terminal, a power supply terminal, a ground terminal, a driving circuit which is connected to said first input terminal, said second input terminal, said output terminal, said power supply terminal and said ground terminal, an adjusting circuit which is connected to said driving circuit, said power supply terminal and said ground terminal, and a biasing circuit which is connected to said driving circuit, said adjusting circuit, said power supply terminal and said ground terminal;

wherein said driving circuit comprises a first FET connected to said first input terminal, a second FET connected to said second input terminal, a third FET which is connected to said first FET and said second FET, a fourth FET connected to said first FET, a fifth FET connected to said second FET, a sixth FET connected to said fourth FET, a seventh FET connected to said fifth FET, an eighth FET connected to said sixth FET and a ninth FET connected to said seventh FET; said adjusting circuit comprise a tenth FET connected to said sixth FET, an eleventh FET connected to said tenth FET, a twelfth FET connected to said tenth FET, a first current source connected to said tenth FET, a thirteenth FET connected to said eleventh FET, and a second current source connected to said eleventh FET; and said biasing circuit comprises a fourteenth FET which is connected to said twelfth FET and said thirteenth FET, a fifteenth FET connected to said fourteenth FET, and a third current source connected to said fourteenth FET.

2. The driver, as recited in claim 1, wherein a gate electrode of said first FET is connected to said first input terminal; a gate electrode of said second FET is connected to said second input terminal; a source electrode of said first FET, a source electrode of said second FET and a drain electrode of said third FET are connected; a drain electrode of said first FET, a gate electrode and a drain electrode of said fourth FET and a gate electrode of said sixth FET are connected; a drain electrode of said second FET, a gate electrode and a drain electrode of said fifth FET, and a gate electrode of said seventh FET are connected; a drain electrode of said sixth FET, a gate electrode and a drain electrode of said eighth FET and a gate electrode of said ninth FET are connected; a drain electrode of said seventh FET, a drain electrode of said ninth FET and said output terminal are connected; a source electrode of said third FET, a source electrode of said eighth FET and a source electrode of said ninth FET are all connected to said power supply terminal; and a source electrode of said fourth FET, a source electrode of said fifth FET, a source electrode of said sixth FET and a source electrode of said seventh FET are all connected to said ground terminal.

3. The driver, as recited in claim 1, wherein a gate electrode of said tenth FET, a gate electrode of said eleventh FET, a gate electrode of said twelfth FET and a gate electrode of said thirteenth FET are connected; a drain electrode of said twelfth FET, a source electrode of said tenth FET and a first terminal of said first current source are connected; a source electrode of said thirteenth FET, a drain electrode of said eleventh FET and a first terminal of said second current source are connected; a second terminal of said first current source and a second terminal of said second current source are both connected to said power supply terminal; and a drain electrode of said tenth FET and a source electrode of said eleventh FET are connected to said ground terminal.

4. The driver, as recited in claim 2, wherein a gate electrode of said tenth FET, a gate electrode of said eleventh FET, a gate electrode of said twelfth FET and a gate electrode of said thirteenth FET are connected; a drain electrode of said twelfth FET, a source electrode of said tenth FET and a first terminal of said first current source are connected; a source electrode of said thirteenth FET, a drain electrode of said eleventh FET and a first terminal of said second current source are connected; a second terminal of said first current source and a second terminal of said second current source are both connected to said power supply terminal; and a drain electrode of said tenth FET and a source electrode of said eleventh FET are connected to said ground terminal.

5. The driver, as recited in claim 1, wherein a gate electrode of said third FET, a gate electrode of said fifteenth FET, a gate electrode and a drain electrode of said fourteenth FET, and a first terminal of said third current source are connected; a drain electrode of said fifteenth FET, a source electrode of said fourteenth FET, a source electrode of said twelfth FET and a drain electrode of said thirteenth FET are connected; a source electrode of said fifteenth FET is connected to said power supply terminal; and a second terminal of said third current source is connected to said ground terminal.

6. The driver, as recited in claim 2, wherein a gate electrode of said third FET, a gate electrode of said fifteenth FET, a gate electrode and a drain electrode of said fourteenth FET, and a first terminal of said third current source are connected; a drain electrode of said fifteenth FET, a source electrode of said fourteenth FET, a source electrode of said twelfth FET and a drain electrode of said thirteenth FET are connected; a source electrode of said fifteenth FET is connected to said power supply terminal; and a second terminal of said third current source is connected to said ground terminal.

7. The driver, as recited in claim 3, wherein a gate electrode of said third FET, a gate electrode of said fifteenth FET, a gate electrode and a drain electrode of said fourteenth FET, and a first terminal of said third current source are connected; a drain electrode of said fifteenth FET, a source electrode of said fourteenth FET, a source electrode of said twelfth FET and a drain electrode of said thirteenth FET are connected; a source electrode of said fifteenth FET is connected to said power supply terminal; and a second terminal of said third current source is connected to said ground terminal.

8. The driver, as recited in claim 4, wherein a gate electrode of said third FET, a gate electrode of said fifteenth FET, a gate electrode and a drain electrode of said fourteenth FET, and a first terminal of said third current source are connected; a drain electrode of said fifteenth FET, a source electrode of said fourteenth FET, a source electrode of said twelfth FET and a drain electrode of said thirteenth FET are connected; a source electrode of said fifteenth FET is connected to said power supply terminal; and a second terminal of said third current source is connected to said ground terminal.

9. A method for accomplishing low power consumption of a driver, comprising a step of: providing a device comprising a first input terminal, a second input terminal, an output terminal, a power supply terminal, a ground terminal, a driving circuit which is connected to the first input terminal, the second input terminal, the output terminal, the power supply terminal and the ground terminal, an adjusting circuit which is connected to the driving circuit, the power supply terminal and the ground terminal, and a biasing circuit which is connected to the driving circuit, the adjusting circuit, the power supply terminal and the ground terminal;

further comprising steps of: inputting a pair of differential signals into the driving circuit by the first input terminal and the second input terminal; amplifying the differential signals which are inputted by the first input terminal and the second input terminal and sending the differential signals into the output terminal by the driving circuit; adjusting a driving current of the driving circuit according to a difference between the differential signals inputted by the first input terminal and the second input terminal by the adjusting circuit; and processing the driving circuit with DC biasing by the biasing circuit;

wherein, when the first input terminal and the second input terminal have identical voltage value, a current of a first current source totally runs through a tenth FET and a current of a second current source totally runs through an eleventh FET; no current runs through a twelfth FET and a thirteenth FET; herein a current running through a third FET is a current of a third current source and thus the current of the third current source is the driving current of the driving circuit; and the driving circuit amplifies the differential signals according to the driving current provided by the adjusting circuit and then sends the differential signals into the output terminal.

10. The method, as recited in claim 9, wherein, when the first input terminal has a larger voltage value than the second input terminal, a gate electrode voltage of an eighth FET increases, which leads to a turning off of the twelfth FET and a turning on of the thirteenth FET; herein a current running through the eleventh FET sharply increases and accordingly a current running through a fifteenth FET also sharply increases because the second current source is unable to provide surplus current, which causes that a current running through the third FET increases sharply, in such a manner that the driving current of the driving circuit increases; and the driving current amplifies the differential signals according to the driving current provided by the adjusting circuit and then sends the differential signals into the output terminal.

11. The method, as recited in claim 9, wherein, when the first input terminal has a smaller voltage value than the second input terminal, a gate electrode voltage of an eighth FET decreases, which leads to a turning off of the thirteenth FET and a turning on of the twelfth FET; herein a current running through the tenth FET increases sharply and accordingly a current running through a fifteenth FET also increases sharply because the first current source is unable to provide surplus current, which causes that a current running through the third FET increases sharply, in such a manner that the driving current of the driving circuit increases; and the driving circuit amplifies the differential signals according to the driving current provided by the adjusting circuit and sends the differential signals into the output terminal.

* * * * *